(12) United States Patent
Kobayashi et al.

(10) Patent No.: US 7,294,965 B2
(45) Date of Patent: Nov. 13, 2007

(54) COLOR-CONVERSION LIGHT-EMITTING DEVICE, METHOD FOR MANUFACTURING THE SAME, AND DISPLAY USING THE SAME

(75) Inventors: Makoto Kobayashi, Nagano (JP); Koji Kawaguchi, Nagano (JP)

(73) Assignee: Fuji Electric Holding Co., Ltd., Tokyo (JP)

( * ) Notice: Subject to any disclaimer, the term of this patent is extended or adjusted under 35 U.S.C. 154(b) by 245 days.

(21) Appl. No.: 10/732,536

(22) Filed: Dec. 11, 2003

(65) Prior Publication Data

US 2004/0135502 A1 Jul. 15, 2004

(30) Foreign Application Priority Data

Dec. 25, 2002 (JP) .............................. 2002-375407

(51) Int. Cl.
*H01J 63/04* (2006.01)
(52) U.S. Cl. ........................ 313/506; 313/504; 313/503
(58) Field of Classification Search ................ 313/506, 313/503, 498–502, 504, 507–512, 169.1, 313/169.3; 428/690–691, 26–29; 345/36, 345/45, 76
See application file for complete search history.

(56) References Cited

U.S. PATENT DOCUMENTS

| | | | | |
|---|---|---|---|---|
| 5,949,188 A | * | 9/1999 | Leising et al. ............... | 313/505 |
| 6,117,529 A | * | 9/2000 | Leising et al. ............... | 428/209 |
| 6,166,489 A | * | 12/2000 | Thompson et al. ......... | 313/506 |
| 6,404,125 B1 | * | 6/2002 | Garbuzov et al. .......... | 313/499 |
| 6,653,778 B1 | * | 11/2003 | Tomiuchi et al. ........... | 313/501 |
| 2003/0071567 A1 | * | 4/2003 | Eida et al. ................... | 313/504 |
| 2003/0230972 A1 | * | 12/2003 | Cok ............................. | 313/504 |

FOREIGN PATENT DOCUMENTS

| | | | | |
|---|---|---|---|---|
| JP | 3-152897 | | | 6/1991 |
| JP | 5-258860 | | | 10/1993 |
| JP | 8-286033 | | | 11/1996 |
| JP | 9-208944 | | | 8/1997 |
| JP | 10-162958 | | | 6/1998 |
| JP | 11-067458 | | | 3/1999 |
| JP | 11-329727 | | | 11/1999 |
| JP | 2000-212554 | | | 8/2000 |
| JP | 2000-256433 | | | 9/2000 |
| JP | 2001093669 A | | * | 4/2001 |
| JP | 2001-217076 | | | 8/2001 |
| JP | 2004-039371 | | | 2/2004 |

* cited by examiner

*Primary Examiner*—Joseph Williams
*Assistant Examiner*—Hana Asmat Sanei
(74) *Attorney, Agent, or Firm*—Manabu Kanesaka

(57) ABSTRACT

A color-conversion light-emitting device includes a color-conversion layer for converting a wavelength distribution of light, a light-emitting unit formed on the color-conversion layer and having a pair of transparent electrodes and an organic EL light-emitting layer disposed between the transparent electrodes, and a color filter layer formed on the light-emitting unit. The color-conversion light-emitting device may further include a reflective layer, a wavelength selection mirror, a second color-conversion layer, or a passivation layer.

15 Claims, 3 Drawing Sheets

COLOR-CONVERSION LIGHT-EMITTING DEVICE, METHOD FOR MANUFACTURING THE SAME, AND DISPLAY USING THE SAME

BACKGROUND OF THE INVENTION AND RELATED ART STATEMENT

The present invention relates to a color-conversion light-emitting device having a long service life, a method of manufacturing, the color-convention light-emitting device, and a display using the device. More particularly, the present invention relates to a color-conversion light-emitting device used for a display of an image sensor, personal computer, word processor, television set, facsimile machine, audio equipment, video equipment, car navigator, electronic desktop calculator, phone, mobile terminal, industrial measuring instrument, and the like.

In recent years, the information technology has been rapidly advanced. A display device used in the information technology has been required to have a better aesthetic appearance, a lighter weight, a thinner thickness and higher performance. Furthermore, a great effort has been made to reduce power consumption and increase a response speed. In particular, many attempts have been made to develop a high-definition full-color display device.

As opposed to a liquid crystal display device, an organic electro-luminescence device (hereinafter referred to as 'organic EL') has been developed as a device having wide-angle visibility and faster response. As a display device, the organic EL display device has characteristics such as (1) high luminance and high contrast, (2) low driving voltage and high emission efficiency, (3) high resolution, (4) wide-angle visibility, (5) high response speed, (6) high definition and multi-color display, (7) lightweight and small thickness, and the like. Thus, the organic EL device is expected to have a better aesthetic appearance, a lighter weight, a thinner thickness and higher performance.

Tohoku Pioneer Corporation has already developed a product with a vehicle-mounted green monochrome organic EL display in November 1997. In order to meet the need of the society, it is desirable to develop an improved organic EL display that is stable for an extended period of time, responds quickly, and displays multiple colors or full colors with high definition.

As a method for manufacturing the organic EL display device for displaying a desired color, a method in which a fluorescent material converts light emitted from a light emitting element to obtain a desired color has been used for a CRT and a plasma display. For example, Japanese Patent Publications No. 03-152897, No. 05-258860, No. 08-286033, and No. 09-208944 have disclosed a color conversion method in which a filter is composed of a fluorescent material for absorbing light with a wavelength in a region of light emitted from an organic light emitting device, so that the fluorescent material emits fluorescence with a wavelength in a visible light region.

In this approach, it is possible to use an organic light emitting device emitting a color other than white, so that the organic light emitting device has higher brightness as a light source. In a case of the color conversion method using an organic light emitting device emitting blue light, a frequency of the blue light is converted to that of green or red light. A color conversion filter containing a fluorescent material with such color conversion effect may be formed in a high-resolution pattern. Accordingly, it is possible to provide a full-color light emitting display even with weak energy light such as near-ultraviolet light or visible light.

Figure 1:
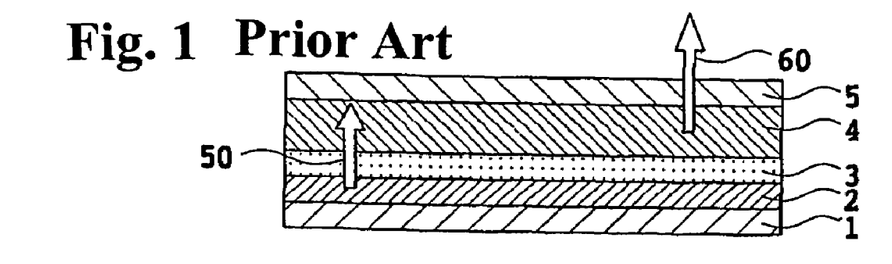
FIG. 1 is view showing a conventional color-conversion light-emitting device.

FIG. 1 is a view showing a conventional color-conversion light-emitting device. The light-emitting device is provided with a light-emitting unit (opaque electrode 1, organic EL layer 2, and transparent electrode 3), a color-conversion layer 4 for converting a wavelength distribution of light emitted from the light-emitting unit, and a color filter layer 5. The light-emitting unit emits blue light as luminescent light, and the color-conversion layer converts the blue light to red or green light.

The color-conversion layer 4 contains a so-called "color-conversion colorant", and the colorant absorbs light 50 from the light-emitting unit and emits fluorescence 60 with a different wavelength through wavelength conversion. It is known that the color-conversion colorant in the color-conversion layer 4 gradually decomposes due to a decomposition reaction resulting from excitation over a long-term use, thereby lowering long-term stability of the color-conversion layer 4.

Among various methods for preventing such a problem in the long-term stability, there has been a method in which the color-conversion layer 4 is made thicker to effectively prevent the problem. However, in the case of a multicolor display formed of a number of color-conversion light-emitting elements, it is difficult to increase a thickness of the color-conversion layer 4 relative to a width of each of the color-conversion light-emitting elements (pixel width). In consideration of a manufacturing process and a viewing-angle, when a pixel width is 50 μm, the color conversion layer needs to have a thickness of no more than 20 μm, preferably 10 μm or less.

Further, it is necessary to increase a concentration of the color-conversion colorant in the color-conversion layer to a very high level, so that the color-conversion layer having such a small thickness has sufficiently large absorption. When the color-conversion layer contains an extremely high concentration of the color-conversion colorant, the color-conversion efficiency is reduced due to concentration quenching. Also, the color-conversion efficiency tends to deteriorate over time due to a higher probability of the decomposition reaction of the color-conversion colorant. As a result, in the current color-conversion system, it is necessary to optimize a balance among the long-term stability, color-conversion efficiency, and manufacturing process to improve the performance.

In view of the problems described above, the present invention has been made, and an object of the present invention is to provide a color-conversion light-emitting device with improved performance without compromising the long-term stability color-conversion efficiency, and manufacturing process.

Another object of the invention is to provide a method of manufacturing the color-convention light-emitting device, and a display using the device.

Further objects and advantages of the invention will be apparent from the following description of the invention.

SUMMARY OF THE INVENTION

In order to achieve the objects described above, according to a first aspect of the present invention, a color-conversion light-emitting device includes a color-conversion, layer for converting a wavelength distribution of light, a light-emitting unit formed on the color-conversion layer and having an organic EL light-emitting layer disposed between a pair of transparent electrodes, and a color filter layer formed on the light-emitting unit. The color-conversion light-emitting device may further include a reflective layer disposed on the color-conversion layer at a side opposite to the light-emitting unit. The color-conversion light-emitting device may further include a wavelength selection mirror disposed between the light-emitting unit and the color filter layer. The color-conversion light-emitting device may further include a second color-conversion layer disposed between the light-emitting unit and the color filter layer. The color-conversion light-emitting device may further include a passivation layer disposed between the light-emitting unit and the color-conversion layer, and/or between the light-emitting unit and the color filter layer.

According to a second aspect of the present invention, a method for manufacturing a color-conversion light-emitting device includes the steps of forming a color-conversion layer on a substrate; forming a light-emitting unit on the color-conversion layer to obtain a light-emitting/color-conversion unit; forming a color filter layer on a transparent substrate to obtain a color filter; and attaching the light-emitting/color-conversion unit to the color filter.

According to a third aspect of the present invention, a method for manufacturing a color-conversion light-emitting device includes the steps of forming a color-conversion layer on a substrate to obtain a color-conversion unit; forming a color filter layer on a transparent substrate and forming a light-emitting unit on the color filter layer to obtain a light-emitting/color filter; and attaching the color-conversion unit to the light-emitting/color filter.

According to a fourth aspect of the present invention, a display includes at least one color-conversion layer for converting a wavelength distribution of light; a light-emitting unit formed on the color-conversion layer and having an organic EL light emitting layer disposed between a pair of transparent electrodes; and a color filter layer formed on the light-emitting unit. One of the transparent electrodes, i.e. the first transparent electrode, may be formed of multiple partial electrodes formed in a line pattern. The other of the transparent electrodes, i.e. the second transparent electrode, may be formed of multiple partial electrodes formed in a line pattern. The line patterns of the first and second transparent electrodes may be arranged to intersect at the right angle.

In the fourth aspect of the present invention, the display may further include a plurality of switching elements (e.g. TFTs). The first transparent electrode is formed of the multiple partial electrodes, and each of the switching elements is connected to each of the partial electrodes. The display may further include a reflective layer on the color-conversion layer at a side opposite to the light-emitting unit. The display may further include a second color-conversion layer disposed between the light-emitting unit and the color filter layer.

DETAILED DESCRIPTION OF PREFERRED EMBODIMENTS

Figure 2:
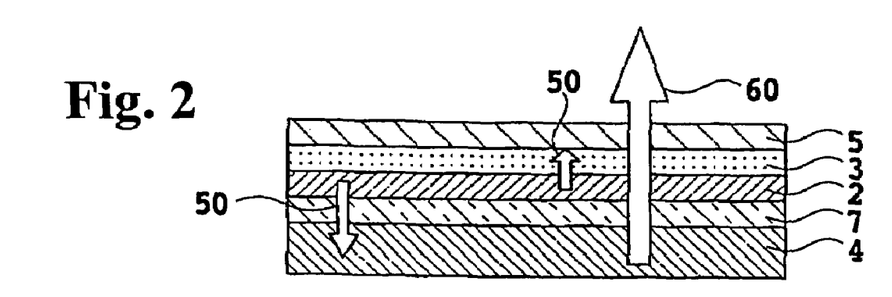
FIG. 2 is a schematic sectional view showing a color-conversion light-emitting device according to an embodiment of the present invention.

Hereunder, embodiments of the present invention will be explained with reference to the accompanying drawings. FIG. 2 is a schematic sectional view showing a color-conversion light-emitting device according to an embodiment of the present invention. As shown in FIG. 2, a color-conversion layer 4, a first transparent electrode 7, an organic EL layer 2, a second transparent electrode 3, and a color filter layer 5 are laminated in this order. A light-emitting unit of the device is formed of the first transparent electrode 7, the organic EL layer 2, and the second transparent electrode 3.

In the embodiment, the color-conversion layer 4 is provided on the light-emitting unit at a side opposite to a direction that the light emits from the device. The light-emitting unit irradiates light 50 on the color-conversion layer 4 to convert a wavelength distribution of the light. After the wavelength distribution conversion, converted light 60 is radiated randomly, and passes through the light-emitting unit and the color filter layer upwardly. With this configuration, it is possible to increase a thickness of the color-conversion layer 4 to improve long-term stability without causing a negative effect on increasing viewing-angle dependence or a manufacturing process.

The color-conversion layer 4 includes a matrix resin and a color-conversion colorant. The materials constituting the color-conversion layer 4 will be described next.

The color-conversion colorant absorbs light ranging from a near ultraviolet region to a visible region emitted from a light source to convert a wavelength distribution to thereby emit visible light with a different wavelength as fluorescence. In particular, it is preferable that the colorant absorbs light ranging from a blue region to a bluish green region. For example, a suitable color-conversion colorant includes a colorant absorbing light ranging from the blue region to the bluish green region to emit fluorescence in a red region, a colorant absorbing light ranging from the blue region to the bluish green region to emit fluorescence in a green region, or a colorant absorbing light ranging from the near ultraviolet region to the visible region to emit the blue fluorescence.

In a case that a light source emits light with a wavelength in the blue or bluish-green region, when the light is converted to light with a wavelength in the red region through a simple red filter, an intensity of the light is greatly reduced due to a small amount of the red light in the original light.

In this case, it is possible to obtain high intensity light with a wavelength in the red region by using a fluorescence colorant to convert the light from the organic light emitting device into the light with a wavelength in the red region.

In the case of obtaining the blue color, an organic fluorescence colorant may be used to convert the blue light with a shorter, wavelength into desired blue light with a different wavelength. Alternatively, it is possible to use a color-conversion colorant that absorbs light in the ultraviolet region to convert it to the blue light.

The fluorescence colorants that absorb the light with a wavelength in the blue or bluish-green region emitted from the light source to emit fluorescence with a wavelength in the red region include, for example, rhodamine-based colorants such as rhodamine B, rhodamine 6G, rhodamine 3B, rhodamine 101, rhodamine 110, sulforhodamine, basic violet 11, and basic red 3, cyanine-based colorants, pyridine-based colorants such as 1-ethyl-2-(4-(p-dimethylaminophenyl)-13-butadienyl)-pyridium-perchlorate (pyridine 1), and oxazine-based colorants. Furthermore, various dyes (direct dyes, acid dyes, basic dyes, disperse dyes, etc.) can be used provided that they are fluorescent.

The fluorescent dyes that absorb the light with a wavelength in the blue region to the bluish green region emitted from the light source to emit fluorescence with a wavelength in the green region include, for example, coumarin colorants such as 3-(2'-benzothiazolyl)-7-diethylamino-coumarin (coumarin 6), 3-(2'-benzimidazolyl)-7-diethylamino-coumarin (coumarin 7), 3-(2'-N-methyl benzimidazolyl)-7-diethylamino-coumarin (coumarin 30) and 2, 3, 5, 6-1H, 4H-tetrahydro-8-trifluoromethylquinolidine (9, 9a, 1-gh) coumarin (coumarin 153), or basic yellow 51 as a dyestuff of a coumarin colorant, and further naphthalimide colorants such as solvent yellow 11 and solvent yellow 116. Furthermore, various kinds of dyes (direct dyes, acid dyes, basic dyes and disperse dyes) can be also used as far as they are fluorescent.

The fluorescent dyes that absorb the light with a wavelength in the near ultraviolet region to the visible region emitted from the light source to emit fluorescence with a wavelength in the blue region include, for example, coumarin colorants such as coumarin 466, coumarin 47, coumarin 2, and coumarin 102. Furthermore, various kinds of dyes (direct dyes, acid dyes, basic dyes and disperse dyes) may be also used as far as they are fluorescent.

According to the present invention, the matrix resin includes polyester methacrylate, polyvinyl chloride, a vinyl chloride-vinyl acetate copolymer resin, an alkyd resin, an aromatic sulfonamide resin, an urea resin, a melamine resin, a benzoguanamine resin, a mixture of these resins, and the like.

When it is necessary to form a pattern of the color conversion layer 4, a photo-setting resin or photo-thermo-setting resin (resist) may be used. In this case, the photo-setting resin or the photo-thermo-setting resin (resist) functions as the matrix resin. In order to form a pattern of the color conversion layer, it is desirable that the photo-setting resin or the photo-thermo-setting resin is soluble in an organic solvent or alkaline solution in an unexposed state.

The photo-setting resin or photo-thermo-setting resin includes (1) a composition containing an acrylic multifunctional monomer/oligomer having acroyl groups or methacroyl groups and a photo- or thermo-polymerization initiator, (2) a composition containing polyvinyl ester cinnamate and a sensitizer, (3) a composition containing a linear or cyclic olefin and bisazido, wherein nitrene is generated to cross-link the olefin, or (4) a composition containing monomers having an epoxy group and a photo oxidizer. In particular, the photo-setting resin or photo- and thermo-setting resin of (1) provides high resolution and easy pattern formation, as well as good solvent- and heat-resistance and the like.

It is preferred that the photo-polymerization initiator, sensitizer, and acid generator initiate the polymerization by light with a wavelength that the color-conversion colorant does not absorb. In the color-conversion layer according to the present invention, when the photo-setting resin or photo-thermo-setting, resin itself can be polymerized by light or heat, the photo- or thermo-polymerization initiator may be omitted.

According to the present invention, a solution including the matrix resin and color-conversion colorant is prepared, and the solution is applied on a transparent substrate with a method known in the art such as spin coating, dip coating, roll coating or screen printing. The solution is then dried to form the color conversion layer 4. Alternatively, a solution including the photo-setting resin or photo-thermo-setting resin, and color conversion colorant is prepared, and the solution is applied on the transparent substrate. The solution is subsequently exposed for patterning, so that the color conversion layer 4 is formed in a pattern. The patterning can be carried out with a commonly employed method in which an organic solvent or alkaline solution that solves or disperses the resin is used to remove the resin at unexposed sections.

In the color-conversion layer 4 of the present invention, the color-conversion colorant is contained more than two micromoles per one gram of the matrix resin, preferably 6 to 20 micromoles, most preferably 10 to 14 micromoles. When the fluorescent colorant is contained at such a concentration, it is possible to convert the color without causing concentration quenching or deterioration.

According to the present invention, the color conversion layer 4 has a film thickness of 5 µm or larger, preferably 8 to 40 µm. With such a film thickness, it is possible to obtain the converted light with a desired intensity and improve the long-term stability.

The light-emitting unit is provided with a pair of transparent electrodes (the first transparent electrode 7 and the second transparent electrode 3) and the organic EL layer 2 disposed between the transparent electrodes.

The first transparent electrode 7 and the second transparent electrode 3 are required to efficiently inject electrons or holes into the organic EL layer 2, and are also necessary to be transparent in a wavelength region of light emitted from the organic EL layer 2 and light converted at the color-conversion layer 4. It is preferred that the first transparent electrode 7 and the second transparent electrode 3 have transmittance of 50% or higher for light with a wavelength in the range of 400-800 nm.

One of the first transparent electrode 7 and the second transparent electrode 3 functions as a negative pole, and the other functions as a positive pole. Any one of the electrodes may be a negative pole. In the transparent electrode employed as a negative pole, a material of the electrode is required to have a small work function for injecting the electron efficiently. Further, the material must be transparent in a wavelength region of the light emitted from the organic EL layer 2 and the light converted at the color-conversion layer 4. A material with a small work function generally has low transparency. Therefore, it is preferred that the transparent electrodes have a laminated structure consisting of multiple layers to obtain the two features.

Specifically, a film with a thickness of 10 nm or less is disposed at a portion contacting the organic EL layer 2. The film is made of an alkaline metal such as lithium or sodium; an alkaline earth metal such as potassium, calcium, magnesium, or strontium; an electron-injecting metal consisting of a fluoride of any of such metals and the like; or an alloy or compound with other metals. When such a material with a small work function is used, it is possible to inject the electron efficiently. Further, the ultra-thin film minimizes a reduction in the transparency. A transparent conductive film such as ITO or IZO is formed on the ultra-thin film. Accordingly, it is possible to reduce an overall resistance of the transparent electrodes and supply a sufficient current to the organic EL layer 2.

On the other hand, in the transparent electrode employed as a positive pole, it is necessary to use a material with a large work function in order to increase the hole-injection efficiency. It is also necessary to use a material with high transparency in a wavelength region of the light emitted from the organic EL layer 2 and the light converted at the color-conversion layer 4. It is preferred to use a transparent conductive film such as ITO or IZO.

The first transparent electrode 7 and the second transparent electrode 3 are formed of the aforementioned materials with a method such as vapor deposition, sputtering, or CVD. When the patterning is required, a method known in the art such as masking and photolithography can be used.

The organic EL layer 2 emits the light ranging from the near ultraviolet region to the visible region, preferably from the blue region to the bluish green region. The emitted light is incident on the color-conversion layer 4 to be converted to the visible light having a desired color. The organic EL layer 2 has a structure including at least an organic EL layer. A hole injection layer, a hole transport layer, and/or an electron injection layer may be included as necessary. Specifically, the following layer arrangements may be used.

(1) Organic EL Light-Emitting Layer (2) Hole Injection Layer/Organic EL Light-Emitting Layer (3) Organic EL light-Emitting Layer/Electron Injection Layer;

(4) Hole Injection Layer/Organic EL Light-Emitting Layer/Electron Injection Layer (5) Hole injection layer/Hole transport layer/Organic EL Light-Emitting Layer/Electron Injection Layer (6) Hole Injection Layer/Hole Transport Layer/Organic EL Light-Emitting Layer/Electron Transport Layer/Electron Injection Layer In the arrangements shown above, a positive electrode is connected to the organic EL light-emitting layer or the hole injection layer, and a negative electrode is connected to the organic EL light-emitting layer or the electron injection layer.

A known material is used for each of the layers. For obtaining the light ranging from blue to bluish green light, for example, fluorescent brighteners such as a benzothiazole type, a benzimidazole type and a benzoxazole type, a metalchelating oxonium compound, a styrylbenzene type compound, an aromatic dimethylidyne type compound, and the like are preferably used for the light emitting layer of the organic light EL. The organic EL layer 2 can be formed with a method known in the art such as vapor deposition.

The color filter layer 5 is provided for passing only a desired wavelength component contained in the light 60 converted at the color-conversion layer 4 and in the light 50 emitted from the organic EL layer 2. For instance, when the blue green light emitted from the organic EL layer 2 is converted at the color-conversion layer 4 to obtain the red light, the color filter layer 5 passes the desired wavelength of the light 60, i.e. the red component, while blocking the blue and green components in the light 50. When the green light is extracted, the color filter layer 5 passes the desired wavelength of the light 60, i.e. the green component, while also passing the green component in the light 50. The blue light is obtained in the same way.

The color filter layer 5 is formed of a material known in the art, for example, a material used for LCDs, and may be formed through deposition of a low-molecular dye.

Figure 3:
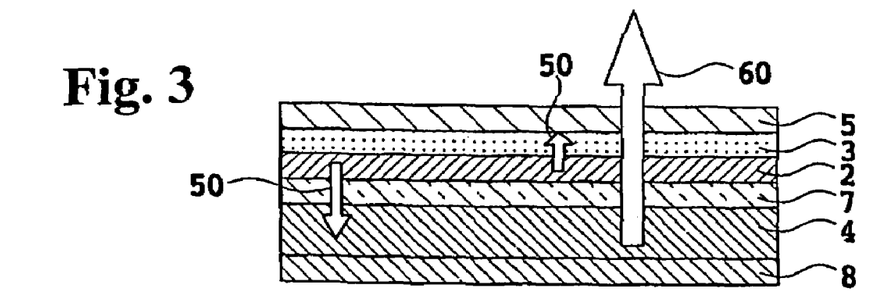
FIG. 3 is a schematic sectional view showing a color-conversion light-emitting device according to another embodiment of the present invention.

FIG. 3 is a view showing a color-conversion light-emitting device according to another embodiment of the present invention. As shown in FIG. 3, the color-conversion light-emitting device further includes a reflective layer 8 formed on the color-conversion layer 4 at a side opposite to the light-emitting unit in addition to the configuration of the device shown in FIG. 2.

In the color-conversion light-emitting device, the light-emitting unit emits light, and the light passes through the color-conversion layer 4 to emit the converted light in random directions. A part of the light passes through the color-conversion layer 4 without the wavelength distribution conversion. The part of the light can be reflected at the reflective layer 8 and return to the color-conversion layer 4 for the wavelength distribution conversion. A part of the converted light converted at the color-conversion layer 4 is also reflected at the reflective layer 8, and passes through the color-conversion layer 4, the light-emitting unit, and the color filter layer 5 toward outside (upward in FIG. 3). Accordingly, with the reflective layer 8, it is possible to improve the efficiency of the light emission and color-conversion. The reflective layer 8 may be formed of metal with high reflectance such as Al, Ag, Mo, and W.

Figure 4:
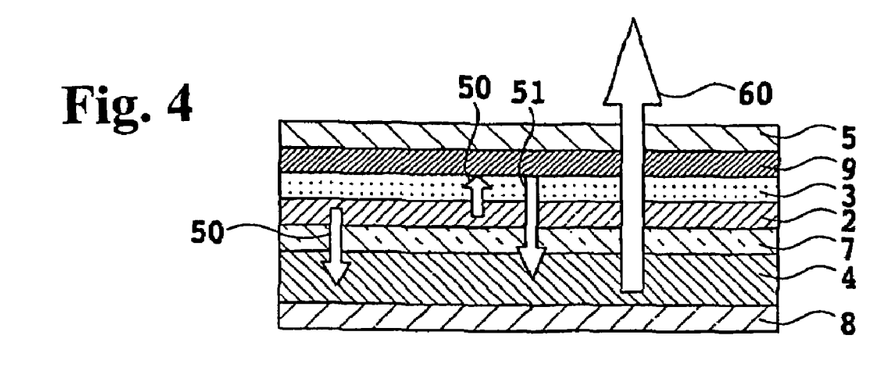
FIG. 4 is a schematic sectional view showing a color-conversion light-emitting device according to a further embodiment of the present invention.

FIG. 4 is a view showing a color-conversion light-emitting device according to a further embodiment of the present invention. As shown in FIG. 4, the color-conversion light-emitting device further includes a wavelength selection mirror 9 disposed between the second transparent electrode 3 and the color filter layer 5 in addition to the configuration of the device shown in FIG. 3.

The wavelength selection mirror 9 selectively reflects the light emitted from the light-emitting unit while passing the light converted at the color-conversion layer 4. The wavelength selection mirror 9 can be formed of alternately laminated thin films, in which each film is made of a material having a different refraction index. Such a material may be $TiO_2$, $SiO_2$, ZnS, $Ta_2O_5$, $MgF_2$, and $Al_2O_3$. The wavelength selection mirror 9 can be formed, for example, by alternately depositing high- and low-refraction materials at desired film thicknesses in a high-vacuum vapor-deposition system. The wavelength selection mirror 9 preferably has a reflectance of 50% or higher at the maximum wavelength of the light emitted from the light-emitting unit, and a transmittance of 50% or higher at the maximum wavelength of the light converted at the color-conversion layer 4. Specifically, the wavelength selection mirror 9 preferably has a reflectance of 70% or higher at the maximum wavelength of the light emitted from the light-emitting unit, and a transmittance of 75% or higher at the maximum wavelength of the light converted at the color-conversion layer.

With the configuration described above, it is possible to reflect the light emitted from the light-emitting unit toward a light-extraction side (toward the color filter layer 5) at the wavelength selection mirror 9, and return the light to the color-conversion layer 4. Accordingly, the light 51 passes through the color-conversion layer 4 to be converted, thereby improving the emission and color-conversion efficiency of the color-conversion light-emitting device.

Figure 5:
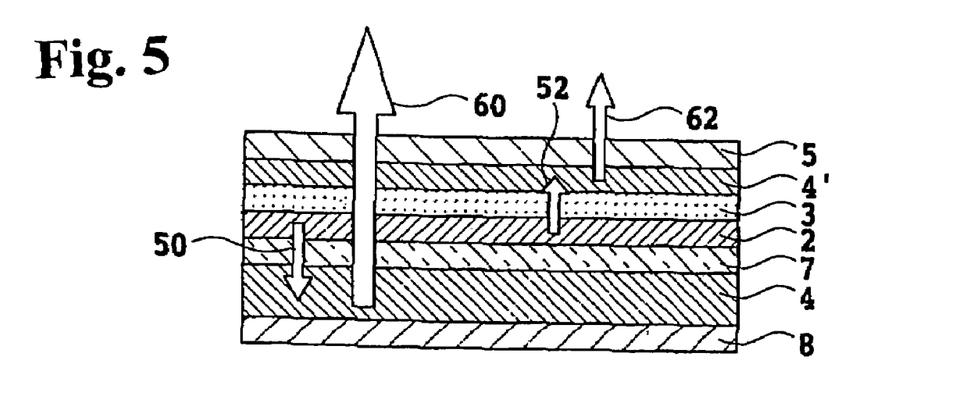
FIG. 5 is a schematic sectional view showing a color-conversion light-emitting device according to a still further embodiment of the present invention.

FIG. 5 is a view showing a color-conversion light-emitting device according to a still further embodiment of the present invention. As shown in FIG. 5, the color-conversion light-emitting device further includes a second color-conversion layer 4' between the second transparent electrode 3 and the color filter layer 5 in addition to the configuration of the device shown in FIG. 3. The second color-conversion layer 4' may be formed of a material same as that of the color-conversion layer 4. In consideration of the viewing-angle dependence and manufacturing process, it is preferred that the second color-conversion layer 4' has a film thickness of 5 μm or more, more preferably from 8 to 15 μm.

In this embodiment, the light 50 emitted from the light-emitting unit toward the color-conversion layer 4 is converted at the color-conversion layer 4 and irradiated as the output light 60. The light 52 emitted from the light-emitting unit toward the second color-conversion layer 4' is converted at the second color-conversion layer 4' and irradiated as output light 62. Therefore, it is possible to efficiently use the light emitted from the light-emitting unit, thereby improving the emission and color-conversion efficiency of the color-conversion light-emitting device.

The constituent layers are sequentially laminated on a substrate to form the color-conversion light-emitting device. The substrate may contact the color-conversion layer 4 or the color filter layer 5. The substrate is formed of a material capable of withstanding manufacturing conditions (e.g. solvent, temperature) of the laminated layers and having excellent dimensional stability. When the substrate contacts the color filter layer 5, i.e. the light extraction side, the substrate is required to be transparent relative to the light to be converted at the color-conversion layer 4 and pass through the color filter layer 5. It is preferred that the substrate has a transmittance of 50% or higher, more preferably 75% or higher, relative to the light with a wavelength in the range of 400-700 nm. A material includes glass and a resin such as polyethylene terephthalate and polymethyl methacrylate, preferably bolosilicate glass or blue flat glass.

When the substrate contacts the color-conversion layer 4, the substrate may be transparent or opaque. A material includes metal, ceramic, glass, and a resin such as polyethylene terephthalate and polymethyl methacrylate and the like. It is preferred that the substrate reflects light emitted from the light-emitting unit and converted at the color-conversion layer. A material with the reflectivity includes metal such as Al, Ag, Mo, and W, and ceramic, glass, and a resin (e.g., polyethylene terephthalate, polymethyl methacrylate) having a surface coated with the metal.

Figure 6:
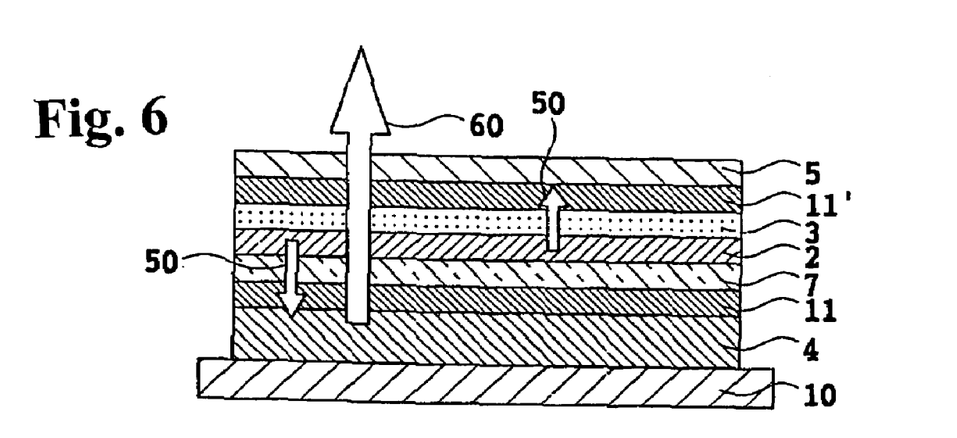
FIG. 6 is a schematic sectional view showing a color-conversion light-emitting device according to a still further embodiment of the present invention.

FIG. 6 is a view showing a color-conversion light-emitting device according to a further embodiment of the present invention. As shown in FIG. 6, the color-conversion light-emitting device further includes a substrate 10 contacting the color-conversion layer 4 and passivation layers 11 and 11' between the color-conversion layer 4 and the first transparent electrode 7, and between the second transparent electrode 3 and the color filter layer 5, in addition to the configuration of the device shown in FIG. 2.

The passivation layers 11 and 11' have a barrier property relative to moisture and alkalis for improving the reliability of the light-emitting unit when the light-emitting unit is susceptible to the moisture or alkalis. The passivation layers 11 and 11' are transparent to the light emitted from the light-emitting unit and converted at the color-conversion layer. The passivation layers 11 and 11' have a transmittance of 20% to 95%, preferably 60% to 95%, relative to the visible light with a wavelength in the range of 400-800 nm. The passivation layers 11 and 11' are formed of, for example, an inorganic oxide or inorganic nitride such as $SiO_x$, $SiN_x$, $SiN_xO_y$, $AlO_x$, $TiO_x$, $TaO_x$, and $ZnO_x$. The passivation layers 11 and 11' may be formed of a single layer or a lamination of multiple layers with a common method such as sputtering, CVD, vacuum deposition, or dipping.

According to the present invention, the constituent layers are sequentially laminated on the single substrate to form the color-conversion light-emitting device as described above. Alternatively, the constituent layers are separately laminated on two substrates, and the two substrates are attached together.

Figure 7:
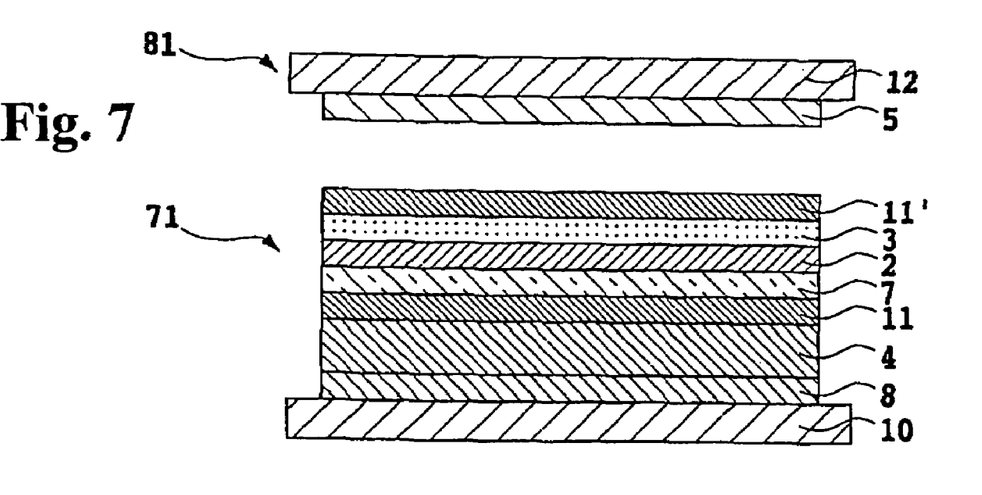
FIG. 7 is a schematic sectional view for describing a method of manufacturing the color-conversion light-emitting device according to the present invention.

FIG. 7 is a view showing a method for manufacturing the color-conversion light-emitting device according to an embodiment of the present invention. As shown in FIG. 7, first, the reflective layer 8, the color-conversion layer 4, the passivation layer 11, the first transparent electrode 7, the organic EL layer 2, the second transparent electrode 3, and the passivation layer 11' are laminated on the substrate 10 to form a light-emitting/color-conversion unit 71. In this case, the reflective layer 8 and the passivation layers 11 and 11' may be omitted.

The substrate 10 may be transparent or opaque, and may have a reflectivity as described above. When the substrate 10 has a high reflectivity, the reflective layer 8 can be omitted. The color filter layer 5 is laminated on a transparent substrate 12 to form a color filter 81 separately. The light-emitting/color-conversion unit 71 is then attached to the color filter 81 to form the color-conversion light-emitting device with a method known in the art. For instance, an adhesive (e.g. UV setting type adhesive) may be applied to an edge portion of the light-emitting/color-conversion unit 71 or the color filter 81.

Figure 8:
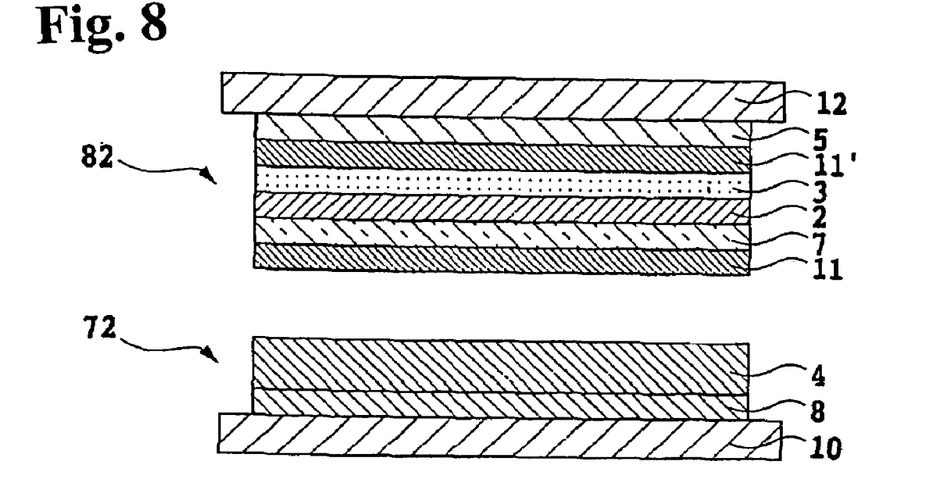
FIG. 8 is a schematic sectional view for describing another method of manufacturing the color-conversion light-emitting device according to the present invention.

FIG. 8 is a view showing a method for manufacturing the color-conversion light-emitting device according to another embodiment of the present invention. As shown in FIG. 8, the reflective layer 8 and the color-conversion layer 4 are first formed on the substrate 10 to form a color-conversion unit 72. The substrate 10 may be transparent or opaque, and may have a reflectivity as described above. When the substrate 10 has a high reflectivity, the reflective layer 8 can be omitted. The color filter layer 5, the passivation layer 11', the second transparent electrode 3, the organic EL layer 2, the first transparent electrode 7, and the passivation layer 11 are sequentially formed on a transparent substrate 12A to form a light emitting/color filter 82 separately. The passivation layers 11 and 11' may be omitted. Then, the color-conversion unit 72 is attached to the light-emitting/color filter 82 to form the color-conversion light-emitting device with a method known in the art. For instance, an adhesive (e.g. UV setting type adhesive) may be applied to an edge portion of the color-conversion unit 72 or the light-emitting/color filter 82.

In the present invention, an entire surface of the device uniformly emits the light. Alternatively, the light-emitting unit may be arranged in a matrix pattern on the single substrate. For instance, each of the first transparent electrode 7 and the second transparent electrode 3 may be formed of multiple partial electrodes having a line pattern. The line patterns of the first transparent electrode 7 and the second transparent electrode 3 are arranged to cross at the right angle, so that a passive matrix drive display can be formed.

Figure 9:
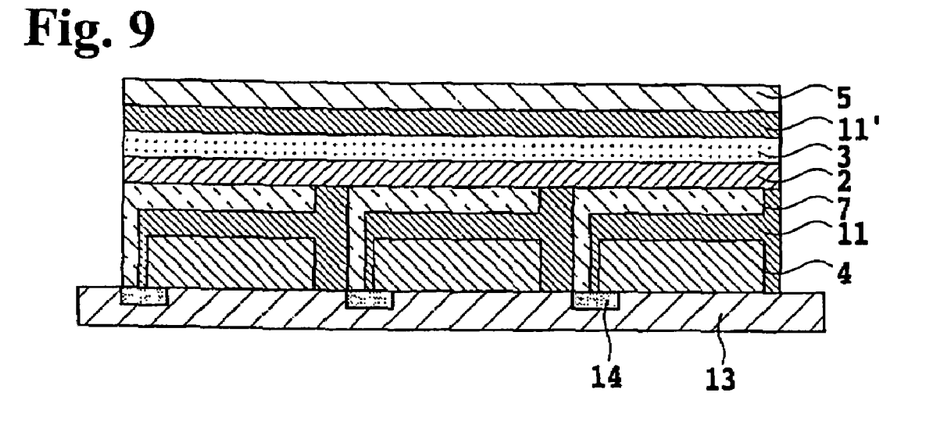
FIG. 9 is a schematic sectional view showing an active-matrix drive display using the color-conversion light-emitting device according to the present invention.

As shown in FIG. 9, the constituent layers may be formed on a TFT substrate 13 having a plurality of TFTs 14. In this case, the TFTs 14 are connected to the first transparent electrode 7, so that an active-matrix drive display can be formed. Instead of the TFTs, it is possible to use a switching element known in the art such as MIM. The TFTs 14 and the first transparent electrode 7 may be connected at a connection portion formed of a material same as that of the first transparent electrode 7. The connection portion may be formed separately using a highly conductive metal (e.g., Au, Ag, Cu, or Al). In the device shown in FIG. 9, the passivation layer 11 is formed to smooth the uneven surface due to the color-conversion layer 4. Alternatively, a separate layer may be provided for smoothing the uneven surface.

According to the present invention, it is also possible to use different types of the color-conversion layer 4 for the display device. For example, color-conversion layers for converting light into the three primary colors (red, green, and blue) are arranged as a single set to obtain a multicolor display. A specific color-conversion layer may be provided in a specific area to obtain so-called "area color display". Multiple types of the color-conversion layer 4 may be arranged in a pattern, a sign, a character, a mark, and the like. Two types of the color-conversion layers may be arranged in a finely divided area with a proper area ratio to display a single color that is difficult to obtain through a single layer.

Figure 10:
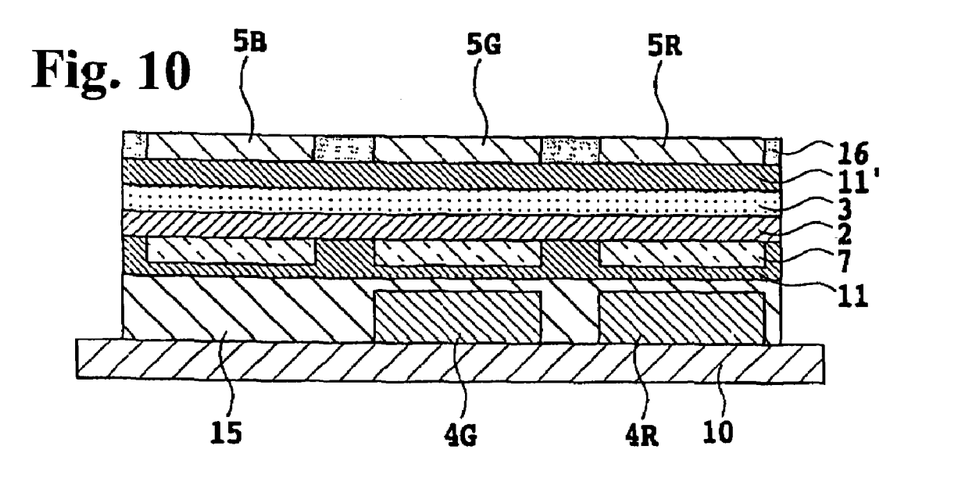
FIG. 10 is a schematic sectional view showing a passive-matrix drive multicolor display using the color-conversion light-emitting device according to the present invention.

FIG. 10 is a view showing a structure of a passive-matrix drive multicolor display. As shown in FIG. 10, a single pixel is formed of three light-emitting units (sub-pixels) for emitting red, green, and blue light. The first transparent electrode 7 has a line pattern extending vertically, and the second transparent electrode 3 has a line pattern extending horizontally. The two line patterns are arranged to intersect at the right angle. A color filter layer is formed of a red color filter layer 5R, a green color filter layer 5G, and a blue color filter layer 5B at positions corresponding to the light-emitting units.

A black mask 16 is disposed between the color filter layers for improving the contrast of the display. A red color-conversion layer 4R is provided in the red color-emitting unit, and a green color-conversion layer 4G is provided in the green color-emitting unit. When the light-emitting unit emits light containing sufficient blue component, the color-conversion layer is not required for the blue color-emitting unit. As shown in FIG. 10, a planarization layer 15 is provided for smoothing an uneven surface between the color-emitting units. The planarization layer 15 may be formed of, for example, a matrix resin used for the color-conversion layers or other materials having the desired properties. The planarization layer 15 is preferably formed of polyimide or an acryl resin.

The reflective layer may be provided on the color-conversion layers 4 at a side opposite to the light-emitting unit. The reflective layer may be divided into portions corresponding to the light-emitting units arranged in the matrix form, or may be formed in one piece. The reflective layer can be formed of a high-reflectance metal such as Al, Ag, Mo, or W.

One or more second color-conversion layers may further be provided between the second transparent electrode 3 and the color filter layer 5. The second color-conversion layers may be arranged in correspondence with the color-conversion layers 4, and may be formed of a material same as that of the color-conversion layers 4. in consideration of the viewing-angle and the manufacturing process, the second color-conversion layers have a film thickness of 5 μm or more, preferably 8 to 15 μm.

EXAMPLE 1

A color-conversion colorant solution was prepared by dissolving coumarine 6 (0.1 parts by weight), rhodamine 6G (0.05 parts by weight), and basic violet 11 (0.05 parts by weight) in propylene glycol monoethyl acetate (120 parts by weight). A light-polymerizing resin "V259PA/P5" (trade name of Nippon Steel Chemical Co., Ltd.) (100 parts by weight) was added in the solution. The solution was applied on a glass substrate by the spin-coating method, and was dried to form the color-conversion layer 4 with a film thickness of 25 μm. A $SiO_2$ film was deposited on the color-conversion layer with the sputtering to form the passivation layer 11 having a thickness of 300 nm.

Next, ITO was deposited with the sputtering to form the first transparent electrode with a film thickness of 200 nm. The substrate with the first transparent electrode was placed in a resistance-heating vapor-deposition apparatus to form the organic EL layer. The organic EL layer was formed of four layers, i.e. a hole-injecting layer, hole-transporting layer, organic EL light-emitting layer, and electron-injecting layer. The organic EL layer was obtained by laminating copper phthalocyanin (CuPc, hole-injecting layer) with a thickness of 100 nm, 4,4'-bis[N-(1-naphthyl)-N-phenylamino]biphenyl ((-NPD, hole-transporting layer) with a thickness of 20 nm, 4,4'-bis(2,2'-diphenyl vinyl)biphenyl (DPVBi, organic EL light-emitting layer) with a thickness of 30 nm, and aluminum tris(8-quinolinolate) (Alq, electron injecting layer) with a thickness of 20 nm continuously in the vacuum chamber at a pressure of $1 \times 10^{-4}$ Pa.

The second transparent electrode was formed by laminating Mg/Ag (10:1 weight ratio) with a thickness of 5 nm and IZO with a thickness of 0.2 μm in the vacuum chamber. The passivation layer was formed by laminating $SiO_2$ with a thickness of 300 nm with the sputtering. Finally, a commercially available color filter material (Color Mosaic CR-7001 of Fuji Film Olin Co., Ltd.) was applied with the spin coating to form the color filter layer with a film thickness of 1.8 μm, so that the color-conversion light-emitting device was obtained.

EXAMPLE 2

Al was deposited on the glass substrate 1 with the vapor deposition method to form the reflective layer 8 with a thickness of 300 nm. Then, similar to Example 1, the color-conversion layer 4, the passivation layer 11, the first transparent electrode 7, the organic EL layer 2, the second transparent electrode 3, the passivation layer 11', and the color filter layer 5 were sequentially formed, so that the color-conversion light-emitting device was obtained.

EXAMPLE 3

Similar to Example 1, the passivation layer and the color-conversion layer were formed. Nine layers of $SiO_2$ and eight layers of $TiO_2$ were alternately deposited with the vapor-deposition in a vacuum state to form the wavelength selection mirror. The wavelength selection mirror had a reflectivity of higher than 75% relative to the vertical incident light with a wavelength of lower than 570 nm, a reflectivity of 50% relative to the vertical incident light with a wavelength of 590 nm, and a transmittance of 75% relative to the vertical incident light with a wavelength of higher than 610 nm. Similar to Example 1, the color filter layer was formed to obtain the color-conversion light-emitting device.

EXAMPLE 4

Similar to Example 1, the passivation layer and the color-conversion layer were formed. The solution used for forming the color-conversion layer was applied to form the second color-conversion layer with a thickness of 10 μm. Similar to Example 1, the color filter layer was formed to obtain the color-conversion light-emitting device.

COMPARATIVE EXAMPLE 1

ITO was deposited on a glass substrate with the sputtering to form the first transparent electrode with a thickness of 200 nm. The organic EL layer, the second transparent electrode, and the passivation layer were formed by the same method as used in Example 1. The solution used for forming the color-conversion layer in Example 1 was applied with the spin-coating method to form the color-conversion layer with a thickness of 10 μm. The commercially available color filter material (Color Mosaic CR-7001 of Fuji Film Olin Co., Ltd.) was applied with the spin-coating to form the color filter layer with a film thickness of 300 nm, so that the color-conversion light-emitting device was obtained.

Evaluation

A constant voltage was applied between the electrodes to measure the brightness of the display as an indicator of color-conversion efficiency. The measurement voltage was a voltage that allowed Comparative Example 1 to emit light with a brightness of 100 cd/m². The stability was evaluated through the brightness after 1000 hours of continuous operation. Table 1 shows the results.

TABLE 1

| | Brightness (cd/m²) | |
|---|---|---|
| | Initial | After 1000 hrs |
| Example 1 | 101 | 70 |
| Example 2 | 120 | 85 |
| Example 3 | 109 | 82 |
| Example 4 | 105 | 73 |
| Comparative Example 1 | 100 | 57 |

As shown in Table 1, it is found that the color-conversion light-emitting device of Example 1 has the initial color-conversion efficiency comparable to (or higher than) that of the conventional color-conversion light-emitting device of Comparative Example 1. Further, it is found that the devices of Examples 2 to 4 having the multiple layers for improving the color-conversion efficiency have initial brightness, i.e. color-conversion efficiency, higher than that of the device of Comparative Example 1. It is also found that Examples 1 to 4 show the excellent log-term stability, i.e. less change in the brightness than Comparative Example 1. Note that Example 4 shows the stability slightly worse than Examples 1 to 3. This is presumably because the second color-conversion layer in the device of Example 4 was situated at a position same as that in the conventional device, so that the second color-conversion layer had lowered the color-conversion efficiency.

EXAMPLE 5

Coumarine 6 (0.1 parts by weight) was dissolved in propylene glycol monoethyl acetate (120 parts by weight) to obtain a color-conversion colorant solution. The light-polymerizing resin "V259PA/P5" (trade name of Nippon Steel Chemical Co., Ltd.) (100 parts by weight) was added to the solution. The solution was applied to the glass substrate with the spin coating, and was dried to obtain the green color-conversion layer having a line pattern with a width of 0.9 μm and a spacing of 2.4 μm.

A fluorescent color-conversion colorant solution was prepared by dissolving coumarine 6 (0.1 parts by weight), rhodamine 6G (0.05 parts by weight), and basic violet 11 (0.05 parts by weight) in propylene glycol monoethyl acetate (120 parts by weight). The light-polymerizing resin "V259PA/P5" (trade name of Nippon Steel Chemical Co., Ltd.)(100 parts by weight) was added to the solution. The solution was applied to the glass substrate with the spin coating, and was dried to obtain the red color-conversion layer having a line pattern with a width of 0.9 μm and a spacing of 2.4 μm. The line patterns of the red color-conversion layer and the green color-conversion layer were arranged in parallel with a spacing of 0.2 μm.

A silicon-based hard coating agent "KP854" (Shinetsu Chemical Co., Ltd.) was applied to the substrate having the color-conversion layer with the spin coating, and was dried to form the planarization layer. ITO was deposited on the planarization layer with the sputtering using a mask to form the first transparent electrode with a thickness of 300 nm in a line pattern with a width of 0.9 μm and a spacing of 0.2 μm. The line patterns of the red color-conversion layer and the green color-conversion layer were arranged directly below the line pattern of the first transparent electrode.

The substrate with the first transparent electrode was placed in a resistance-heating vapor-deposition apparatus to form the organic EL layer. The organic EL layer was formed of four layers, i.e. a hole-injecting layer, hole-transporting layer, organic EL light-emitting layer, and electron-injecting layer. The organic EL layer was obtained by laminating copper phthalocyanin (CuPc, hole-injecting layer) with a thickness of 100 nm, 4,4'-bis[N-(1-naphthyl)-N-phenylamino]biphenyl ((-NPD, hole-transporting layer) with a thickness of 20 nm, 4,4'-bis(2,2'-diphenyl vinyl)biphenyl (DPVBi, organic EL light-emitting layer) with a thickness of 30 nm, and aluminum tris(8-quinolinolate) (Alq, electron-injecting layer) with a thickness of 20 nm at the vacuum chamber pressure of $1 \times 10^{-4}$ Pa. Further, Mg/Ag (10:1 weight ratio) with a thickness of 5 nm and IZO with a thickness of 300 nm were formed in the vacuum to form the second transparent electrode in a line pattern with a width of 0.9 μm and a spacing of 0.2 μm. The line patterns of the second transparent electrode and the first transparent electrode are arranged to intersect at the right angle.

SiO₂ was deposited with the sputtering to form the passivation layer with a thickness of 300 nm. The commercially available color filter material (Color Mosaic CR-7001 by Fuji Film Olin Co., Ltd.) was applied with the spin coating method, and dried to obtain the red color filter layer with a film thickness of 2 μm with portions of 0.9 μm×0.9 μm arranged with a spacing of 2.4 μm. The green color filter layer, the blue color filter layer, and the black mask, each with a thickness of 2 μm, were formed by using commercially available color filter materials (Color Mosaic CG-7001 (green) of Fuji Film Olin Co., Ltd., Color Mosaic CB-7001 (blue) of Fuji Film Olin Co., Ltd., and CK8400L (black mask) of Fuji Film Arch Co.), respectively. The display thus obtained showed small viewing-angle dependence and the excellent long-term stability.

As described above, according to the present invention, the color-conversion layer is provided on the light-emitting unit opposite to the light-extraction direction. Accordingly, it is possible to obtain the color-conversion light-emitting device with the improved long-term stability. Also, it is possible to easily provide the color-conversion light-emitting device with the color-conversion efficiency higher than that of the conventional color-conversion light-emitting device. Further, the color-conversion light-emitting devices are arranged in a matrix pattern to provide the display with the excellent viewing-angle dependence. Accordingly, it is possible to provide the color-conversion light-emitting device with the improved overall performance without compromising the long-term stability, the color-conversion efficiency, and the manufacturing process.

While the invention has been explained with reference to the specific embodiments of the invention, the explanation is illustrative and the invention is limited only by the appended claims.

What is claimed is:

1. A color-conversion light-emitting device comprising:
   a color-conversion layer for converting a wavelength distribution of light,
   a light-emitting unit formed on the color-conversion layer and having a pair of transparent electrodes and an organic EL layer between the pair of the transparent electrodes, and
   a color filter layer formed on the light-emitting unit at a side opposite to the color-conversion layer, the light exiting the device at a side of the color filter layer,
   wherein the color-conversion layer absorbs light emitted from the light-emitting unit and emits light with a wavelength different from that emitted from the light-emitting unit as fluorescence.

2. A color-conversion light-emitting device according to claim 1, further comprising a reflective layer formed on the color-conversion layer at a side opposite to the light-emitting unit.

3. A color-conversion light-emitting device according to claim 1, further comprising a wavelength selection mirror disposed between the light-emitting unit and the color filter layer.

4. A color-conversion light-emitting device according to claim 1, further comprising a second color-conversion layer disposed between the light-emitting unit and the color filter layer, said second color-conversion layer absorbing the light emitted from the light-emitting unit and emitting light with the wavelength different from that emitted from the light-emitting unit as fluorescence.

5. A color-conversion light-emitting device according to claim 1, further comprising a substrate contacting one of the color-conversion layer and the color filter layer.

6. A color-conversion light-emitting device according to claim 1, further comprising a passivation layer disposed between the color-conversion layer and the light-emitting unit.

7. A color-conversion light-emitting device according to claim 1, further comprising a passivation layer disposed between the color filter layer and the light-emitting unit.

8. A display comprising at least one color-conversion light-emitting device according to claim 1.

9. A display according to claim 8, wherein said pair of the transparent electrodes is divided into a plurality of partial electrodes formed in a line pattern, one of said pair of the transparent electrodes crossing the other of the pair of the transparent electrodes with a right angle.

10. A display according to claim 8, further comprising a plurality of switching elements, one of the pair of the transparent electrodes being formed of a plurality of partial electrodes connected to each of said plurality of the switching elements.

11. A display according to claim 10, wherein said plurality of the switching elements is TFTs.

12. A display according to claim 8, further comprising a reflective layer formed on the color-conversion layer at a side opposite to the light-emitting unit.

13. A display according to claim 8, further comprising a second color-conversion layer disposed between the light-emitting unit and the color filter layer, said second color-conversion layer absorbing the light emitted from the light-emitting unit and emitting light with the wavelength different from that emitted from the light-emitting unit as fluorescence.

14. A color-conversion light-emitting device according to claim 1, wherein said color-conversion layer is disposed under the light-emitting unit so that a part of light emitted from the light-emitting unit is subjected to wavelength distribution conversion at the color-conversion layer, and converted light passes through the light-emitting unit and the color filter layer and exits the device at the side of the color filter layer.

15. A color-conversion light-emitting device according to claim 1, wherein said color-conversion layer comprises a matrix resin and a color-conversion colorant, said color-conversion colorant absorbing light ranging from a near ultraviolet region to a visible region emitted from the light emitting unit.

\* \* \* \* \*

UNITED STATES PATENT AND TRADEMARK OFFICE
CERTIFICATE OF CORRECTION

PATENT NO. : 7,294,965 B2
APPLICATION NO. : 10/732536
DATED : November 13, 2007
INVENTOR(S) : Makoto Kobayashi et al.

It is certified that error appears in the above-identified patent and that said Letters Patent is hereby corrected as shown below:

On Title Page item 73

Please change Assignee's name, "Fuji Electric Holding Co., Ltd., Tokyo (JP)" to --Fuji Electric Holdings Co., Ltd., Tokyo (JP)--, Column 1, line 11, "manufacturing," too --manufacturing--, Column 2, line 30, "color conversion" too --color-conversion--, Column 2, line 51, "the long-term stability" to --long-term stability,--, Column 3, line 34, "light emitting" to --light-emitting--, Column 3, line 56, "FIG. 1 is view" to --FIG. 1 is a view--, Column 5, line 7, "a shorter," to --a shorter--, Column 5, line 21, "can be used" to --can be used,--, Column 6, line 10, "thermo-setting," to --thermo-setting--, Column 6, line 20, "color conversion" to --color-conversion--, Column 7, line 38, "light-Emitting" to --Light-Emitting--, Column 7, line 39, "Layer;" to --Layer--, Column 7, line 42, "Hole injection layer/Hole transport layer/Organic EL" to --Hole Injection Layer/Hole Transport Layer/Organic EL--, Column 10, line 45, "light emitting/color filter 82" to --light-emitting/color filter 82--, Column 11, line 58, "layers 4. in" to --layers 4. In--, and

UNITED STATES PATENT AND TRADEMARK OFFICE
CERTIFICATE OF CORRECTION

PATENT NO. : 7,294,965 B2
APPLICATION NO. : 10/732536
DATED : November 13, 2007
INVENTOR(S) : Makoto Kobayashi et al.

It is certified that error appears in the above-identified patent and that said Letters Patent is hereby corrected as shown below:

Column 13, line 51, "log-term stability," to --long-term stability--.

Signed and Sealed this

First Day of April, 2008

JON W. DUDAS
*Director of the United States Patent and Trademark Office*